United States Patent [19]

Serrano

[11] Patent Number: 4,466,106
[45] Date of Patent: Aug. 14, 1984

[54] FREQUENCY SHIFT KEYED MODEM CHIP SET

[75] Inventor: Arthur L. Serrano, Canoga Park, Calif.

[73] Assignee: Novation, Inc., Chatsworth, Calif.

[21] Appl. No.: 297,266

[22] Filed: Aug. 28, 1981

[51] Int. Cl.³ .......................................... H04L 27/10
[52] U.S. Cl. ......................................... 375/9; 375/88; 329/112
[58] Field of Search .................... 375/8, 9, 45, 48, 79, 375/82, 88, 89, 90, 91, 94; 329/112; 364/724

[56] References Cited

U.S. PATENT DOCUMENTS

| | | | |
|---|---|---|---|
| 3,302,114 | 1/1967 | Hertog | 375/90 |
| 3,719,779 | 3/1973 | Wilson | 375/88 |
| 3,937,882 | 2/1976 | Bingham | 375/8 |
| 4,115,738 | 9/1978 | Mitarai et al. | 375/82 |
| 4,336,613 | 6/1982 | Hewes | 375/9 |

OTHER PUBLICATIONS

Laker, "Equivalent Circuit for the Analysis and Synthesis of Switched Capacitor Network", A.T.T., The Bell System Technical Journal, vol. 58, No. 3, Mar. 1979.

Primary Examiner—Robert L. Griffin
Assistant Examiner—Stephen Chin
Attorney, Agent, or Firm—Blakely, Sokoloff, Taylor & Zafman

[57] ABSTRACT

Integrated circuit universal frequency shift keyed modems using switched capacitor recursive filters are disclosed. The modems are comprised of two integrated circuits, the first providing the transmitting capability for any of a plurality of conventional transmit modes and the second providing a receive capability for the corresponding modes, including all filtering on chip as is required prior to detection. In this manner, any of a number of conventional modems may be realized using the two chip set and a minimum of external circuitry. Because of the versatility of the chip set, other functions and objectives may be achieved by the use thereof.

14 Claims, 22 Drawing Figures

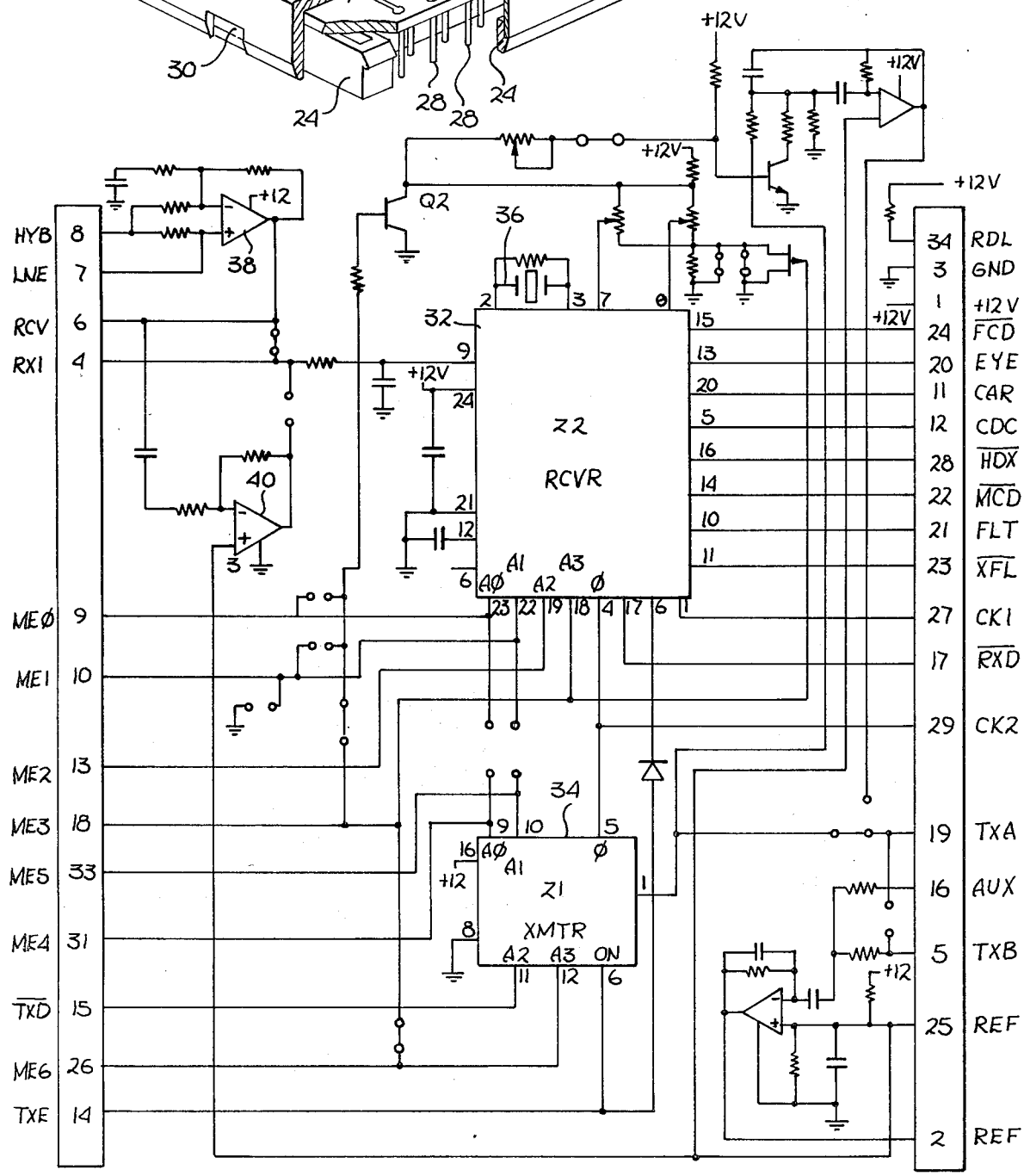

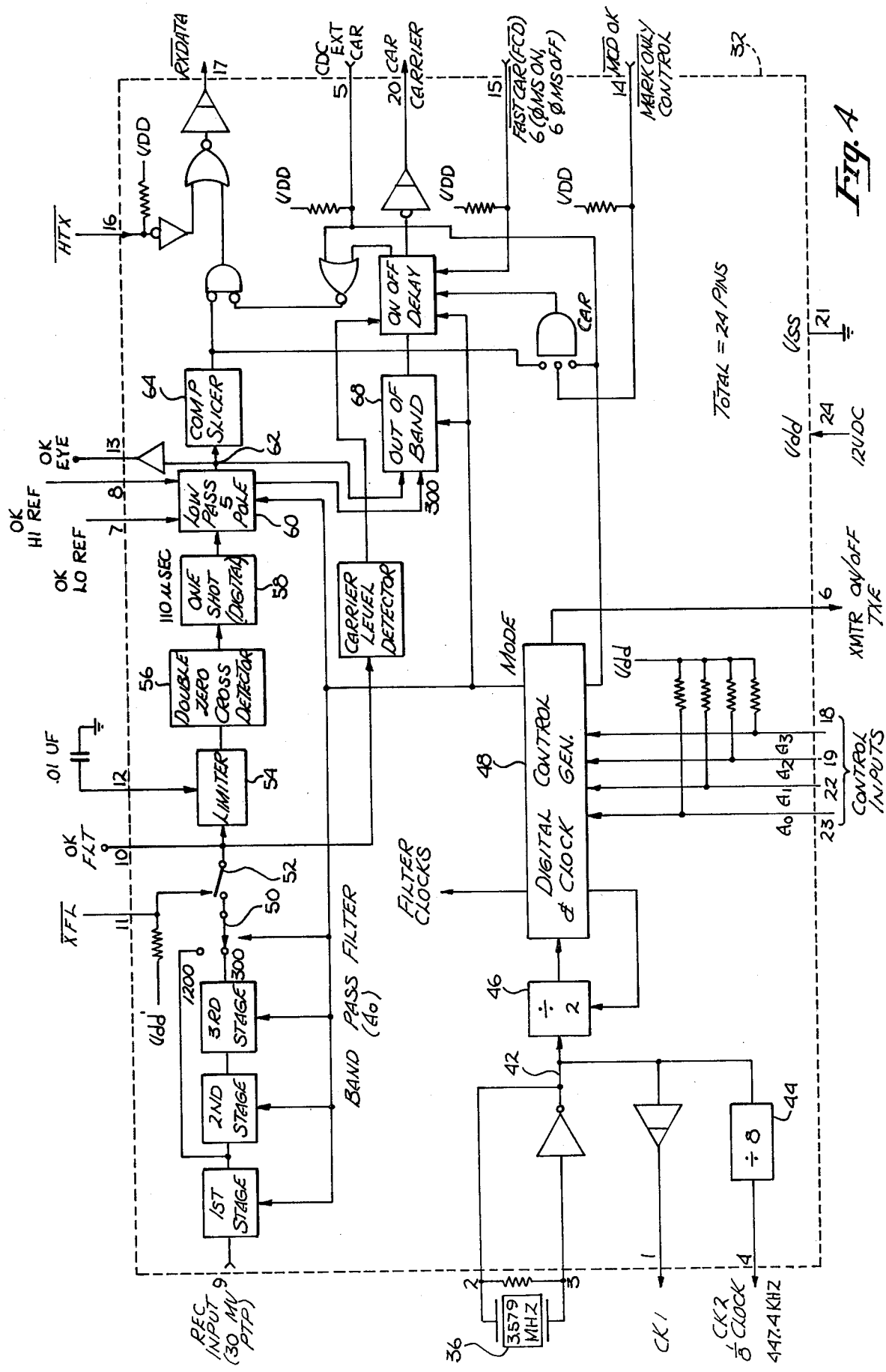
Fig. A

Fig. 5a  RECEIVER MODES

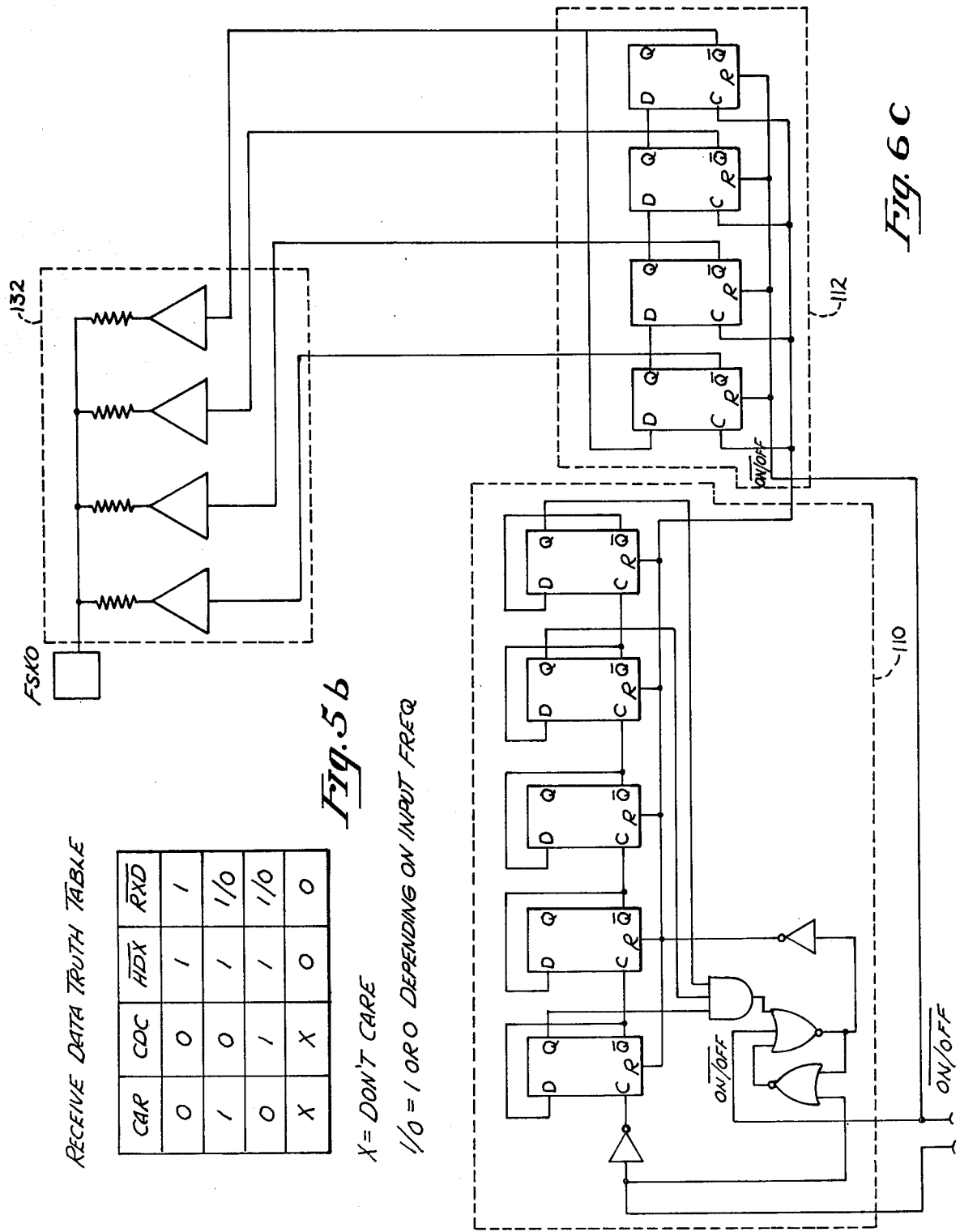

Fig. 5c

MODE TABLE

| LSM | MODE | CONTROL | | | | | | | TRANSMITTER | | | | RECEIVER(2) | | |
|---|---|---|---|---|---|---|---|---|---|---|---|---|---|---|---|
| | | MEØ | ME1 | ME2 | ME3 | ME4 | ME5 | CDC(1) | TRF | XMTR | TXD STATE | FREQ | FREQ | RXD | STATE |
| 30 | ANS | 0 | 0 | 0 | 0 | 0 | 0 | X | X | ON | 1 | MK 2225 | 1270 | 1 | MK |
| | | 0 | 0 | 0 | 0 | 0 | 0 | X | X | ON | 0 | SP 2025 | 1070 | 0 | SP |
| | | 0 | 0 | 0 | 0 | 0 | 0 | X | X | OFF | | | | | |
| | ORIG | 1 | 1 | 1 | 1 | 1 | 0 | 1 | 1 | ON | 1 | MK 1270 | 2225 | 1 | MK |
| | | 1 | 1 | 1 | 1 | 1 | 0 | 1 | 1 | ON | 0 | SP 1070 | 2025 | 0 | SP |
| | | 1 | 1 | 1 | 1 | 1 | 0 | 0 | X | ON | X | | | | |
| | | 1 | 1 | 1 | 1 | 1 | 0 | 0 | 0 | OFF | X | | | | |
| | ANS/TEST | 0 | 0 | 0 | 0 | 0 | 0 | X | X | ON | 1 | MK 1270 | 1270 | 1 | MK |
| | | 0 | 0 | 0 | 0 | 0 | 0 | X | X | ON | 0 | SP 1070 | 1070 | 0 | SP |
| | ORIG/TEST | 1 | 1 | 1 | 1 | 1 | 0 | X | X | ON | 1 | MK 1270 | 1270 | 1 | MK |
| | | 1 | 1 | 1 | 1 | 1 | 0 | X | X | ON | 0 | SP 1070 | 1070 | 0 | SP |
| | | 1 | 1 | 1 | 1 | 1 | 0 | X | 0 | OFF | X | | | | |
| 120 | XMIT | 0 | 0 | 0 | 0 | 1 | 1 | X | 1 | ON | 1 | MK 1300 | | | |
| | | 0 | 0 | 0 | 1 | 0 | 1 | X | 1 | ON | 0 | SP 2100 | | | |
| | | 0 | 0 | 1 | 0 | 0 | 0 | X | 1 | ON | 0 | SFT/C 0 900 | | | |
| | | X | X | X | X | X | X | X | 0 | OFF | X | ANS/T 2025 | | | |
| | RCV | 0 | 0 | 1 | 1 | X | X | X | 0 | OFF | X | | 1300 | 1 | MK |
| | | 0 | 0 | 1 | 1 | X | X | X | 0 | OFF | X | | 2100 | 0 | SP |
| 45 | XMIT | 1 | 0 | 0 | 0 | 0 | 0 | X | 1 | ON | 1 | MK 1400 | | | |
| | | X | 0 | 0 | 0 | 0 | 0 | X | 1 | ON | 0 | SP 1800 | | | |
| | | 1 | 0 | 0 | 0 | 0 | X | X | 0 | OFF | X | | | | |
| | RCV | 1 | 1 | 1 | 1 | 1 | X | X | 0 | OFF | X | | 1400 | 1 | MK |
| | | 1 | 0 | 1 | 1 | 1 | X | X | 0 | OFF | X | | 1800 | 0 | SP |
| ALL | DIAL BUSY (3) | 0 | 0 | 1 | 0 | 1 | X | X | X | OFF | X | | | | |

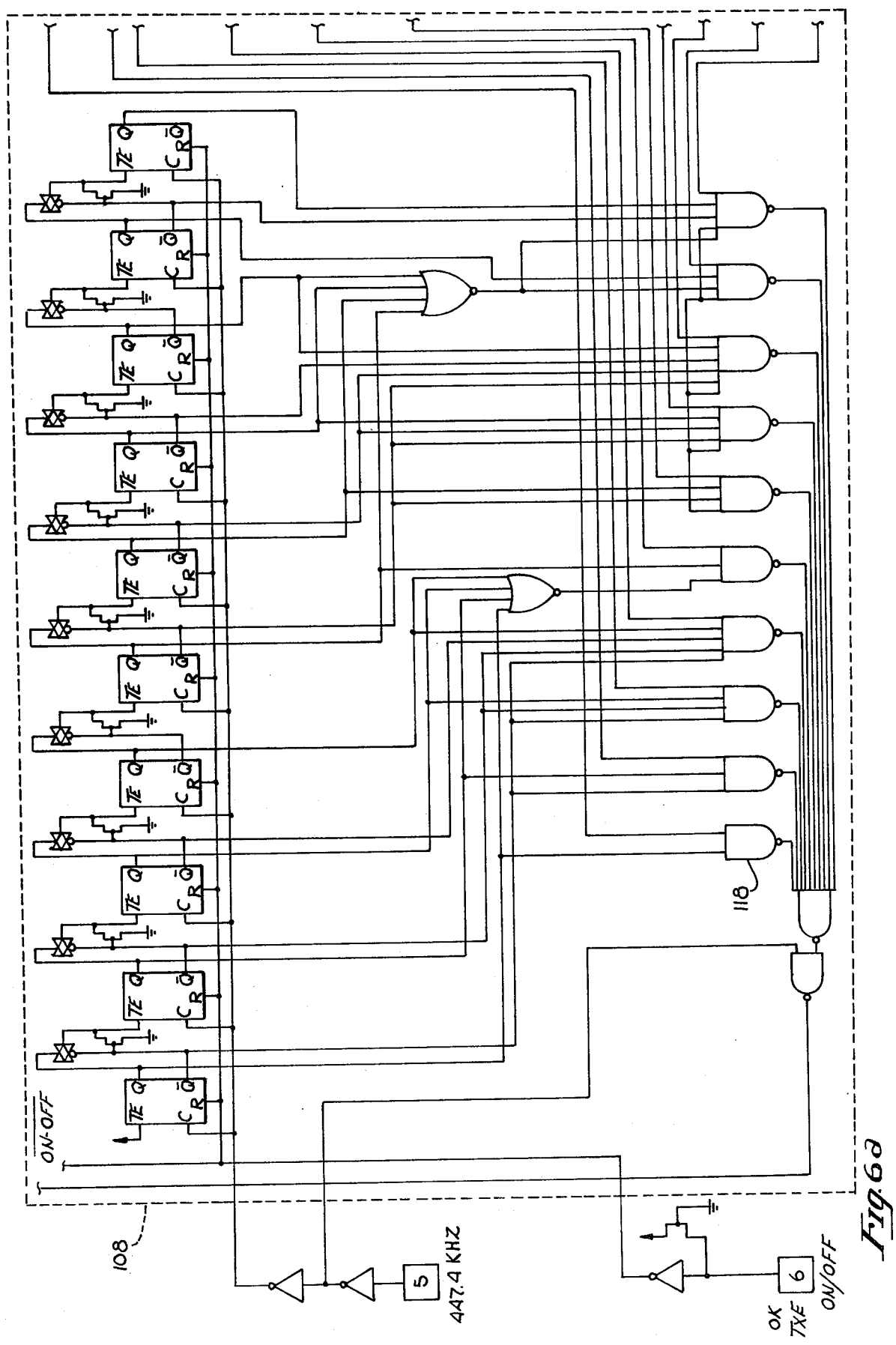

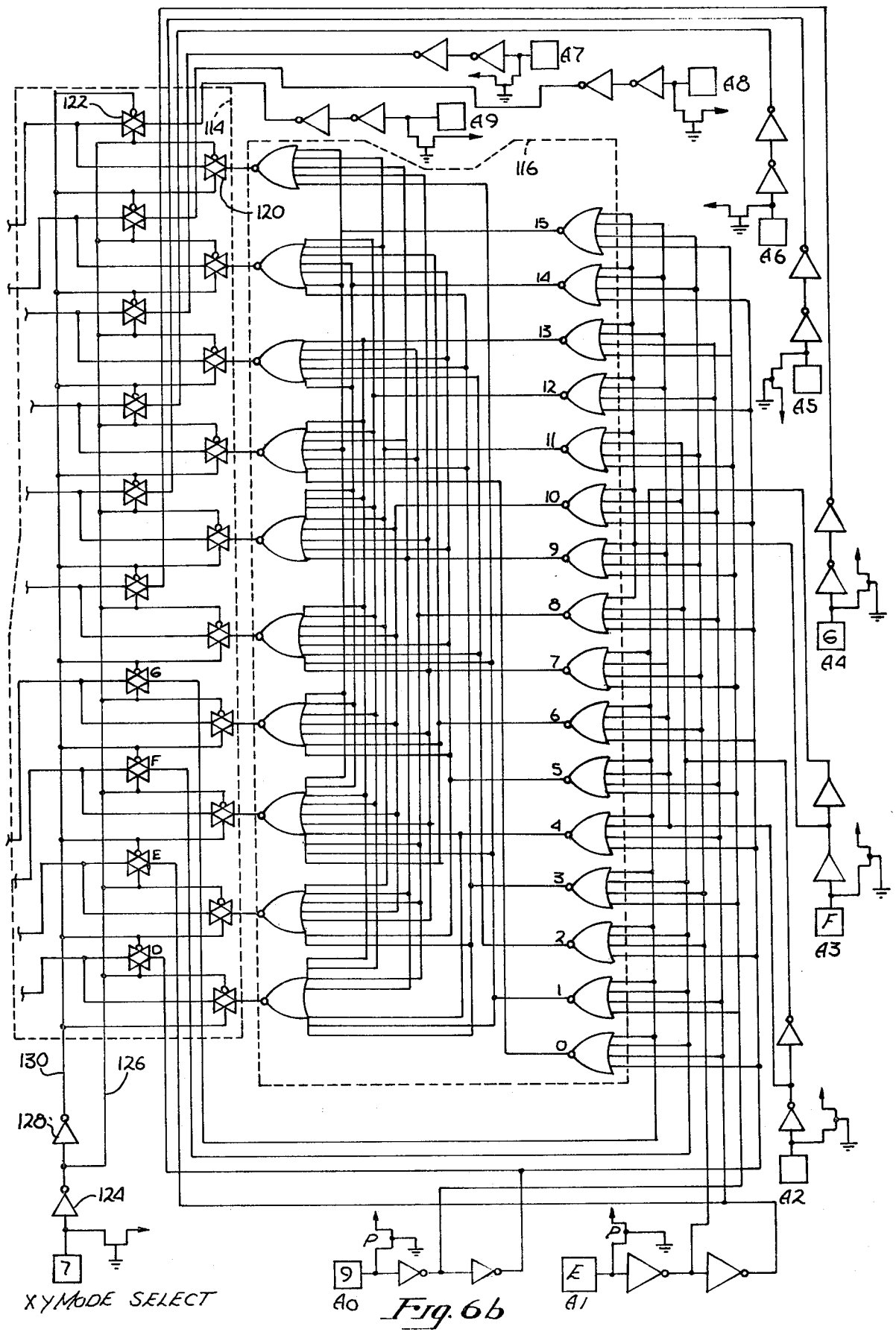
XY MODE SELECT       Fig. 6b

FREQUENCY SHIFT KEYED MODEM CHIP SET

BACKGROUND OF THE INVENTION

1. Field of the Invention

The present invention relates to the field of modems, i.e., modulator/demodulator sets for the transmission and reception of digital data over phone lines.

2. Prior Art

Various techniques are well-known and widely used for digital communication over phone lines using modems, i.e., modulator/demodulator sets at each end of the phone line. Applications for such equipment include communication between remote, even portable terminals and a central computer, and communications between computers. With the recent advances in microprocessor and other digital integrated circuit technology which has greatly increased computer capability and reduced cost in the burgeoning personal computer market, there is a corresponding expanding market for competitively priced modems capable of communicating between themselves or communicating with pre-existing modems of pre-established characteristics. Because of the number of different pre-existing modems, each with their own communication characteristics, prior art modems are generally each specifically identified as to type, and each is generally limited to communication with another modem of the same type.

In the prior art, modems were generally built using discrete components and standard integrated circuits in a special circuit design to achieve the desired modem type compatability. Attempts have been made to provide specialized integrated circuits to achieve lower cost modems, although certain unique requirements of modems have limited the success of such integrated circuit devices. In particular, considerable filtering is required in the receiver as part of the signal detection. Heretofore, this filtering, which comprises a substantial portion of the receiver itself, has not been done on chip, with the result that a number of circuit functions accomplished by the special integrated circuits is limited and the total parts count required to achieve an operative modem using the integrated circuits is still quite substantial.

BRIEF DESCRIPTION OF THE DRAWINGS

FIG. 1 is a perspective view of a printed circuit board mount package containing the modem chip set of the present invention.

FIG. 2 is a schematic diagram of the modem circuit of FIG. 1.

FIG. 4 is a block diagram of the receiver chip 32 of the modem of FIGS. 1 and 2.

FIGS. 5a through 5c are charts illustrating the various modes of the modem of the present invention.

FIGS. 6a through 6c are detailed circuit diagrams for the transmitter chip.

FIGS. 9a and 9b are of circuit diagrams of the digital control and clock generator of the receiver chip.

DETAILED DESCRIPTION OF THE INVENTION

Figure 3:
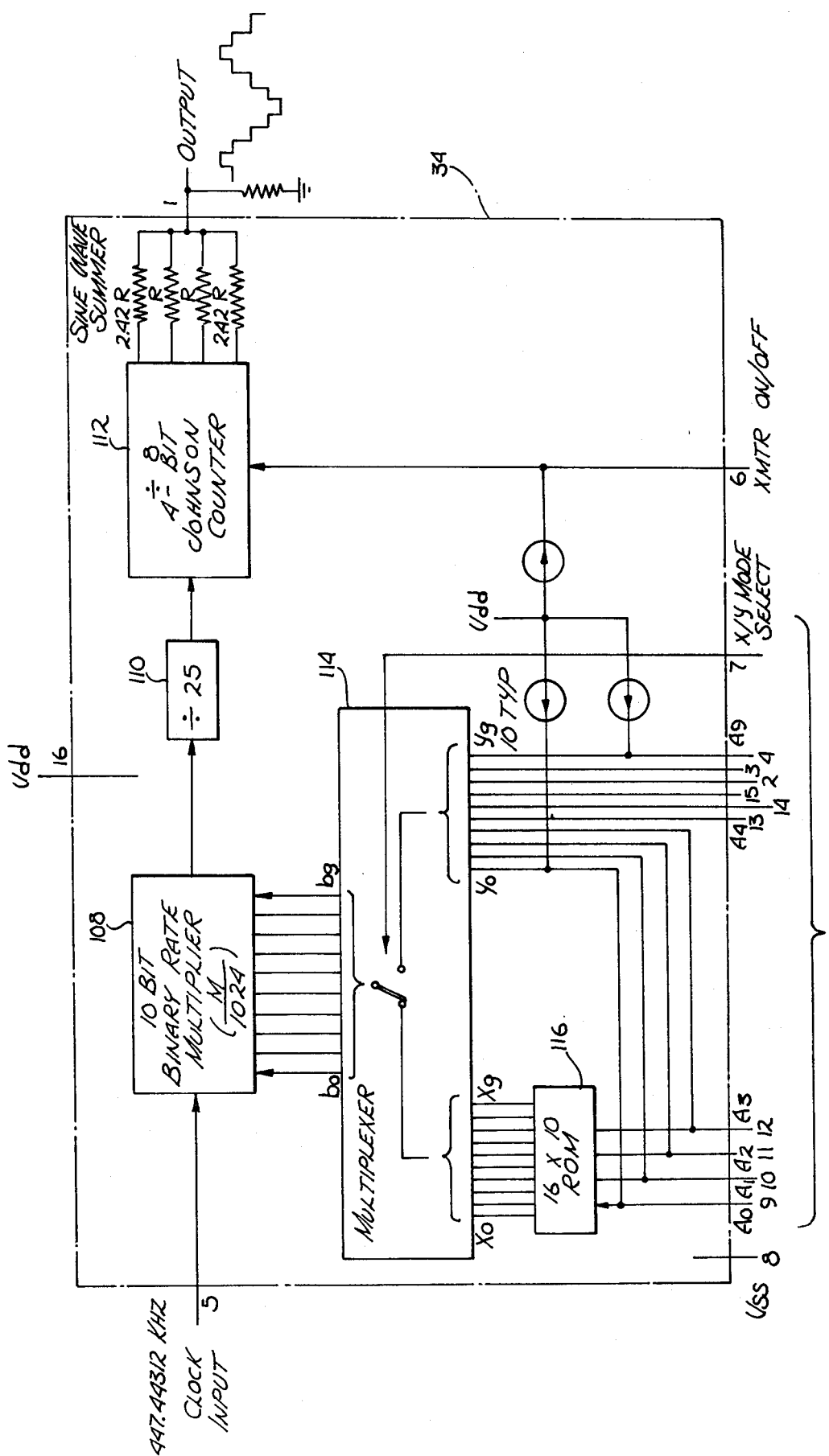
FIG. 3 is a block diagram of the transmitter chip 34 of the modem of FIGS. 1 and 2.

First, referring to FIG. 1, a perspective view of the modem package 20 of the preferred embodiment of the present invention may be seen. The package 20 is comprised of upper and lower injection molded covers 22 and 24, which snap together with a printed circuit board 26 therebetween so as to retain and provide an enclosure for the printed circuit board with the modem thereon. The printed circuit board itself is provided with a plurality of terminal pins 28 along one end thereof which project downward over an appropriately disposed slot in the lower member 24 to provide access thereto by a connector on a larger (system) printed circuit board, on a ribbon cable, etc. The package of FIG. 1 is provided with recesses 30 on each end thereof for receipt of a small screw clamp to retain the package in the presence of vibration.

The circuit on the printed circuit board comprising the entire modem, using the universal chip set of the present invention, may be seen in FIG. 2. The chip set itself is comprised of two integrated circuits, specifically a receiver circuit 32 and a transmitter circuit 34, with the two integrated circuits being supported by minimal additional circuitry and connected to various terminals comprising the terminals 28 of FIG. 1. The various pin numbers of each of the integrated circuits 32 and 34 are given in FIG. 2, as are the pin numbers corresponding to terminals 28 in FIG. 1 so as to provide better continuity and clarity in the descriptions to follow, in that the pin numbering on the integrated circuits is carried through in the successive drawings illustrating the detailed circuits therein.

It is perhaps best to now describe the signals appearing on the connector pins as identified in FIG. 2 even though many of these signals, their generation and function will be subsequently described in greater detail. A 3.579 MHz crystal 36 provides a frequency reference to both the receiver chip 32 and the transmitter chip 34, the crystal frequency also being available as an output on pin 27 as the CK1 signal. The circuits are powered through pins 1 and 3 with a nominal 12 volt input, pin 3 being the power and signal return or ground. Pin 2 or XMT is the transmit output terminal. This is a low impedance output of the transmit buffer/mixer used to drive a 600 ohm line. The pin is biased to +6 volts DC and must be AC coupled to an external load for a four wire mode, and is normally connected to HYB (pin 8) in a two wire mode. Pins 4 and 5, RXI and TXB, are generally not used, but are internally connected to pins 6 and 19 respectively. RCV on pin 6 is a receiver test point and is a low impedance output of the receiver buffer. Biased at +6 volts DC, signals on the LNE input will have a gain of 12 DB at this point. LNE on pin 7 is the analog input/output, normally connected to a phone line interface module in two wire applications. This line has an impedance of 600 ohms and is biased at +6 volts DC. In applications not using an appropriate phone line interface the phone line must be coupled to this input.

HYB on pin 8 is a hybrid input normally connected to the XMT output in two wire applications. In a four wire mode this signal must be connected to REF (pin 25) for proper biasing of the internal operational amplifier.

ME0 on pin 9 is the mode enable zero input forming the A0 input for the receiver chip 32. FIG. 5A presents the various receiver modes wherein it will be noted that the receiver control input A0 is zero or at the low state for the answer modes and is one or at the high state for the originate modes. Thus in FIG. 2 ME0 is also identified as $\overline{ANS}$. ME1 on pin 10 is the mode enable 1 input corresponding to the receiver mode control A1, the primary function of ME1 being to select between US and CCITT standards.

The signal on pin 11 is the carrier detect output CAR, a positive logical signal indicating the detection of a valid carrier signal. The carrier detect controlled input CDC on pin 12 controls the transmitter in the originate mode and clamps the receive data to mark if CAR is zero. The interrelationship between CAR, CDC, $\overline{HDX}$ and $\overline{RXD}$ (the last two to be subsequently described) may be seen in the receive data truth table of FIG. 5B and in the mode table of FIG. 5C.

The mode enable signal 2 or ME2 on pin 13 corresponds to the receiver control input signal A2, primarily controlling between the normal operation and self test modes of the modem. TXE on pin 14 is the transmit enable input used to turn the transmitter off by overriding internal control logic when measuring line receive levels. It is also used in half duplex communications when the low speed modem module is to be compatible with the Bell 202 series and as a deaf modem (Weitbrecht TDD). $\overline{TXD}$ on pin 15 is the transmit data input to the transmitter. An external pullup resistor to the plus 12 volt supply is required when $\overline{TXD}$ is driven by open collector logic. Zero is space (SP) and one is mark (MK). The AUX signal on pin 16 is an auxiliary input to the transmit buffer used in four wire applications to control the transmit level. In two wire applications it is used to input voice or tone dialing signals when the transmitter is off. The transmit buffer is a single pole low pass filter with a corner frequency of 4 KHz. If it is not used, AUX should be connected to the REF output. Signals presented on AUX must be AC coupled to this input. $\overline{RXD}$ on pin 17 is a receive data output of the receiver representing the digital output of the modem. Again, zero is space and one is mark. ME3 on pin 18 is the mode enable 3 input corresponding to the receiver mode control A3 of FIG. 5A. TXA on pin 19 is the transmit level adjustment for the modulator output. It is internally connected to the transmit buffer of the transmitter and increases the transmit level to zero DB in 4 wire applications by connecting a resister between AUX and TXA. The eye pattern test point EYE on pin 20 provides the analog output of the receiver (demodulator) for test purposes. FLT on pin 21 is the high impedance output of the receive filter providing a filter output test point. $\overline{MCD}$ on pin 22 is the mark carrier detect control input. When enabled, the carrier will be detected if only mark frequency is received and CDC is low. Once the carrier is detected, normal data will be allowed. For $\overline{MCD}$, zero is on and one is off. Pin 23 is connected to internal circuitry on the receiver chip but is not used and should not be connected to any voltage load or signal.

$\overline{FCD}$ on pin 24 is the fast carrier detect control input. When enabled, both the carrier on and off timing is set to 6 milliseconds with zero being on and one being off. REF on pin 25 is a reference voltage, specifically plus 6 volts AC bypassed to ground. Pin 26 is generally not used, though is connected to MA3 in the circuit of FIG. 2 and should not be connected to any other voltage or signal. CK1 on pin 27 is the clock 1 output, specifically a 3.579 Mz open collector clock signal which may be used for driving external CMOS devices. Pin 28 is a half duplex transmit data input $\overline{HDX}$. The digital output of the demodulator is ORed with this input, which is normally used to allow receive data to copy transmit data (see FIG. 5B). Zero represents a space and one a mark.

CK2 on pin 29 is the clock 2 output, a 447.4 KHz 12 volt clock signal (CK1/8). Pins 30 and 32 are not connected in the modem module and accordingly have no effect on the operation thereof. Pins 31 and 33, ME4 and ME5, are the mode enable 4 and mode enable 5 signals respectively representing the transmitter control signals A0 and A1 as shown in the mode table of FIG. 5C. Finally, the receive data load RDL is on pin 34. This terminal has a 10K ohm pullup resistor to the plus 12 volt supply and should be connected to $\overline{RXD}$ when driving CMOS logic or operational amplifier circuits.

As previously described, the four input signals ME0 through ME3 are the control inputs to the receiver chip setting the receiver modes. In the embodiment shown, ME3 is also strapped to the base of transistor Q2 which, when turned on, steps the high and low reference voltages provided to the receiver chip on pins 8 and 7 respectively. These four control signals correspond to the control inputs A0 through A3 shown in FIG. 5A which, among other things, identify the various modes for the receiver. The first eight modes operate at 300 baud and correspond either to the Bell 100 (U.S. standard) or the CCITT V. 21 (European standards set by International Committee). The Bell 100 as well as the CCITT V. 21 are full duplex modes whereas the 202 is not. It can be seen from the first eight modes that answer and originate as well as answer self test and originate self test are provided for both the U.S. and the CCITT devices. For a performance as a Bell 202 FSK modem, the U.S. and CCITT V.23 standards are close enough so that only one mode is required, this mode operating at 1200 baud. In addition, a mode compatible with the TDD network for the deaf (Weitbrecht standard) is provided to allow communications at 45.5 baud. Finally, a mode is provided which essentially devides the frequency of mode 2 in half which effectively lowers the frequency response of the receiver chip, a mode which is useful to detect dial tones. It may be seen from the receiver modes of FIG. 5A that generally A0 causes switching between between answer and originate modes, A1 switches between U.S. and CCITT modes, A2 switches between normal operation and self test operation and A3 switches between 300 baud and other baud rates.

Now referring to FIG. 4, a block diagram of the receiver chip 32 may be seen. As previously mentioned, the system operates on a 3.579 MHz crystal 36 driven from the receiver chip in a conventional manner to provide the 3.579 MHz clock frequency on line 42. This signal in turn is buffered and provided as the CLK output (see FIG. 2) and is also divided by eight by a frequency divider 44 to provide a 447.4 kHz clock reference signal which, as may be seen in FIG. 2, is normally coupled directly to the transmitter chip 34 to provide the clock reference thereto. The buffered clock frequency is divided in half by controllable divider 46 and provided to a digital control and clock generator 48 which is responsive to control signals A0 through A3 to provide a plurality of filter clock signals and a mode control signal to various circuits on the receiver chip. The digital control on the clock generator is also responsive to a transmitter on-off signal (TXE in FIG. 2). The mode control and filter clocks are used to control a number of switched capacitor recursive filters, details of which will be subsequently described.

In the receive mode, the received signal provided through pin RXI (See FIG. 2) or a corresponding input, is coupled through pin 9 of the receiver chip 32 to a controllable band pass filter comprising for 300 baud a three stage switched capacitor filter, emulating a six pole Butterworth filter. These filters are generally also controllable in their operating characteristics, with the natural frequency and the damping ratio for the Butterworth filters being provided for the various modes in FIG. 5. An electronic switch 50 is provided at the filter output, also controlled through the digital control and clock generator, with the switch being operative in the 1200 baud mode to bypass the second and third stage of filtering. A second switch 52 is also provided which allows the injection of an external signal instead of the output of the filters in the event an externally filtered receive signal is to be used on the input $\overline{EXF}$.

The output of the filter is available on the filter test point FLT, and is directly coupled to a voltage limiter 54 which squares up the receive signal for application to the zero cross detector 56 (in frequency shift keying the frequency being received is normally detected by detection of the zero crossings rather than the full wave form). The output of the zero cross detector is used to trigger a one shot 58, the output of which passes through a five pole low pass filter 60 to provide the conventional eye pattern output on line 62. Two reference level adjust pins are provided to trim the low pass filter output levels. The high ref pin is connected only when $A_0$ is high, the low ref only when $A_0$ is low. The internal circuitry is such that reference variations that are proportional to $V_c$ will not affect the trim. In conventional frequency shift keyed modems, data is transmitted by shifting between two frequencies, the lower of which is referred to as a space and the higher of which is referred to as mark. The low pass filter, of course, provides a higher voltage output when the lower frequency is being detected so that a comparator 64 using a reference which is approximately one-half way between a mark and a space will detect which is being received to provide the modem output $\overline{RXD}$ through a series of amplifiers and gates. For example, gate 66 allows the logical mixing ("ORing") of $\overline{HTX}$ with the output when desired. In particular, for half duplex operation, the locally generated copy may be applied to $\overline{HTX}$ to provide an immediate output at $\overline{RXD}$ corresponding to the transmitted copy. In full duplex operation on the other hand, the transmitted copy is immediately received and processed through the receiver, the pullup resistor on $\overline{HTX}$ in FIG. 4 eliminating the need for any positive control of $\overline{HTX}$ for full duplex operation.

The output of the low pass filter 60 is available externally as an eye pattern test point EYE and is coupled to an out-of-band detector 68 which, operating through a delay circuit 70 provides signal CAR indicating whether a valid carrier signal (above predetermined minimum amplitude and frequency) is received. If a valid carrier signal is not being received, the output of delay 70, being coupled to gate 72, will clamp the output $\overline{RXD}$ at mark (the high state). The output $\overline{RXD}$ may also be affected by other signals such as the external carrier signal on pin 5 of the receiver chip which, when low, will clamp the data output to mark (high). Similarly, an $\overline{MCD}$ input will also clamp the output at mark hold. The carrier output CAR will be low for input signals which are below a prescribed minimum. When the fast carrier $\overline{FCD}$ input on pin 15 is low, it sets the carrier detect CAR high and sets the delay of the on-off delay 70 to a maximum of 6 ms regardless of the mode control status. When $\overline{mark\ only\ MCD})/$ and external carrier (CDC) inputs are low, marks only will activate the turn on time delay. Receive spaces will reset the delay timer. However, if external carrier is high, the turn on time will be activated by marks, spaces or random data. The turn on and turn off delay times for the various modes are shown in FIG. 5.

Figure 7:
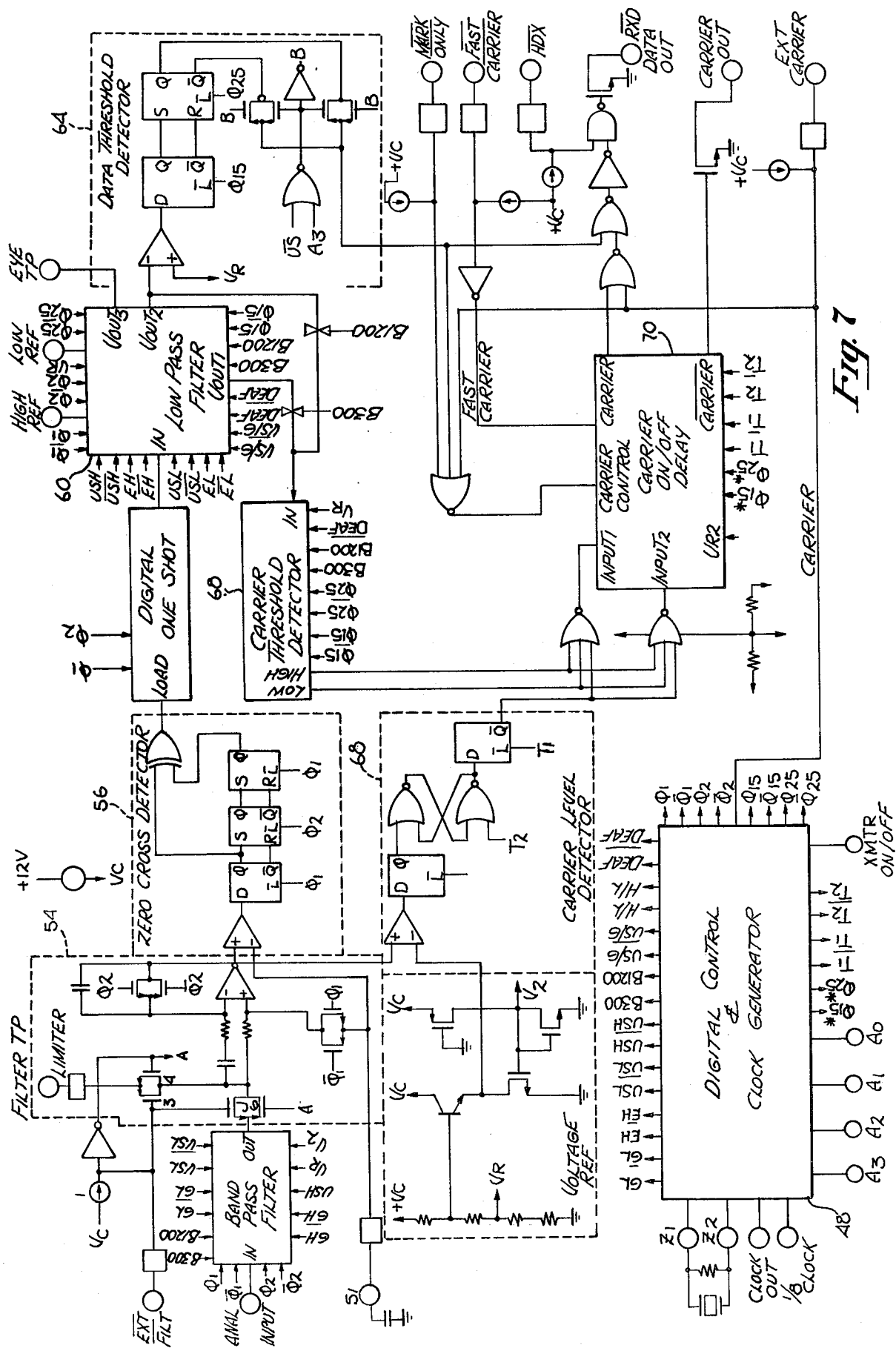
FIG. 7 is a more detailed diagram of the receiver chip circuit.
Figure 13:
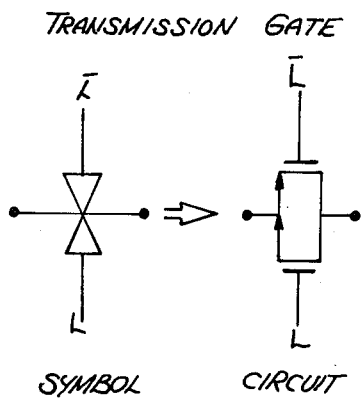
FIGS. 13 and 14 present the symbols used in many of the prior diagrams and corresponding detailed circuits for transmission gates and current sources respectively.
Figure 14:
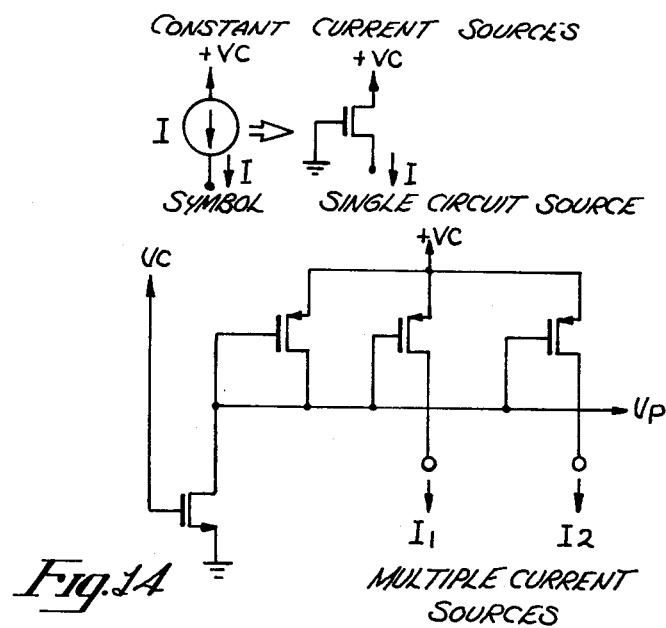

The various circuits for the receiver chip are shown in somewhat greater detail in FIG. 7 and in full detail in various other figures herein. In these various figures, certain symbols are used for recurring circuits, those circuits being shown in detail in FIGS. 13 and 14. In particular, FIG. 13 illustrates the symbol commonly used for a transmission gate with a specific circuit for the gate being shown therebeside. FIG. 14, on the other hand, illustrates the symbol used for a current source together with the circuits for a single source and multiple current sources. In FIG. 7 which as previously mentioned, follows FIG. 4 carefully, though provides greater detail for the various circuits, phantom lines are drawn around various portions of the circuit to identify various functional blocks in the same basic form as those blocks were identified in FIG. 4. In certain instances in FIG. 7, the entire circuit for the particular block is provided, such as by way of example, in the case of the limiter 54, the zero cross detector 56, the carrier level detector (out of band) 68, and various portions of the output circuitry. In other instances, only a block representing a functional element and identifying the various input and output signals with respect thereto is shown, the detail circuits themselves being provided in other figures.

Figures 9B, 9D:
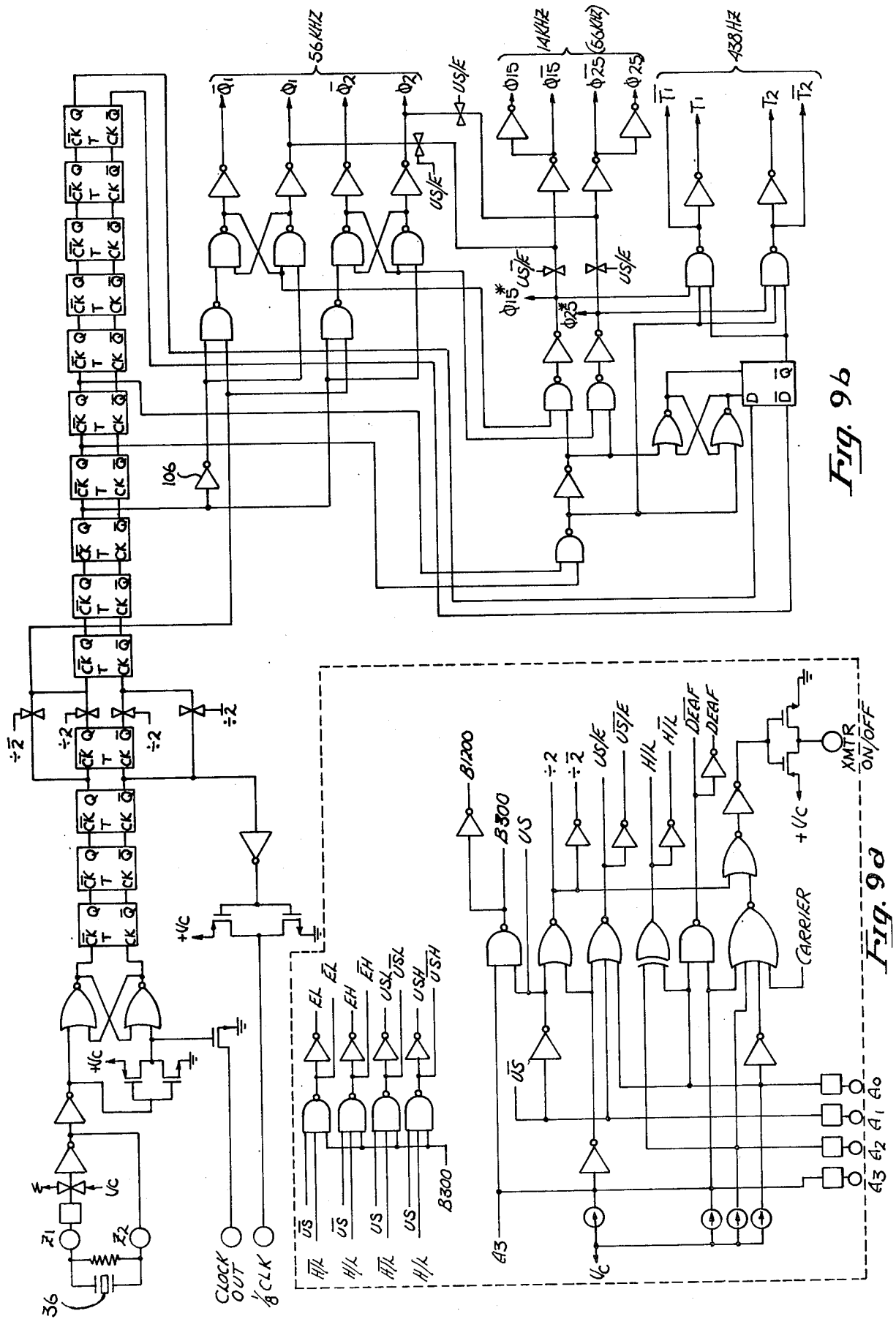

As previously mentioned, one of the features of the present invention is the use of switched capacitor recursive filters which allow the accomplishment of the required filtering on chip in comparison to other prior art modems. In the present invention, the switched capacitor recursive filters, together with the special digital control and clock generation system, allows the realization of an LSI modem of exceptional flexibility and utility. Thus it may be seen that the digital control and clock generator 48 which provides substantially all of the controls and timing signals in response to various user set inputs is the heart of this chip. This portion of the circuit is actually comprised of two sections, one that processes the basic four control inputs $A_0$ through $A_3$ shown in FIG. 9A, and one which divides down the frequency of crystal 36 to provide a number of clock signals for internal timing of the various circuits as shown in FIG. 9B. It can be seen from FIG. 9A that the control signals $A_0$ through $A_3$, which determine the mode, are essentially merely decoded and logically combined to provide quite a number of control signals for controlling the various circuit functions of the other circuits to be described herein. In addition however, the carrier detect signal is used as an input to the circuit which, when combined with the control signals, provides the transmitter on-off signal. Basically, in modems of this type, the receive function takes priority over the transmit function so that the transmitter is enabled on a valid carrier detect signal. The basic timing portion of the circuit shown in FIG. 9B is driven by the crystal 36 which, after appropriate buffering, provides a clock output, and after being divided by eight and buffered, provides the one-eighth clock output hereinbefore described. The clock frequency is further divided down by a chain of additional flip-flops, one of which is normally bypassed, though in mode 10 (see FIG. 5) is active so as to further divide down the system clock by an additional two. Various flip-flop outputs are logically combined as shown to provide a number of clock frequency outputs ranging from approximately 438 Hz to 56 kHz.

Figure 8:
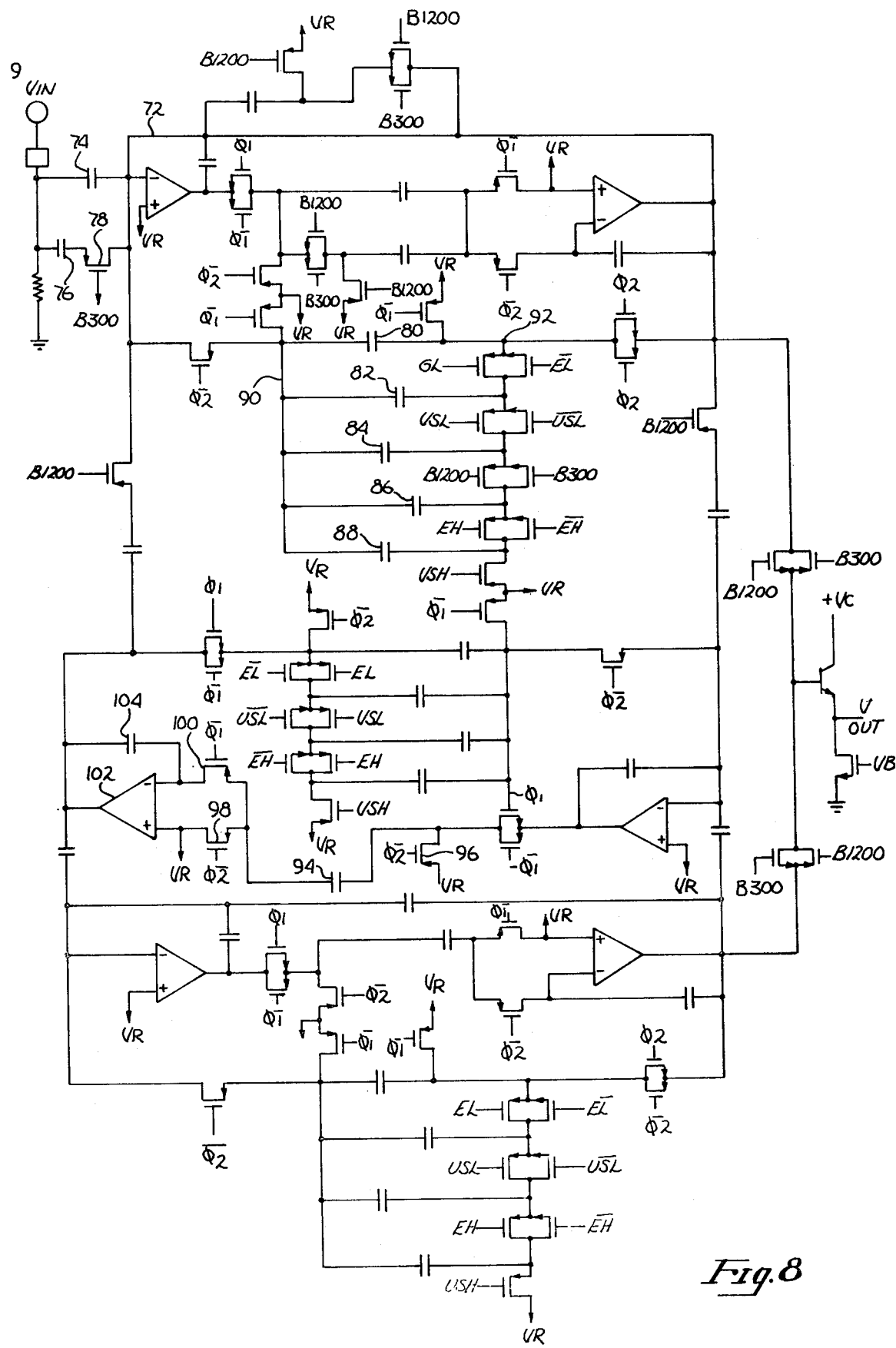
FIG. 8 is a circuit diagram of the band pass filter on the receiver chip.
Figure 15:
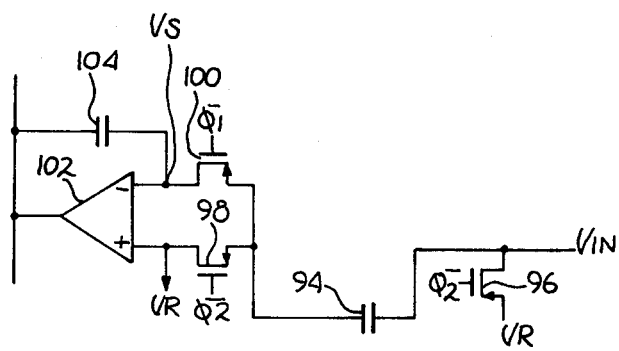
FIGS. 15 and 16 show an isolated portion of FIG. 8 as exemplary of the switched capacitor techniques used in the present invention, and of the equivalent circuit therefore, respectively.
Figure 16:
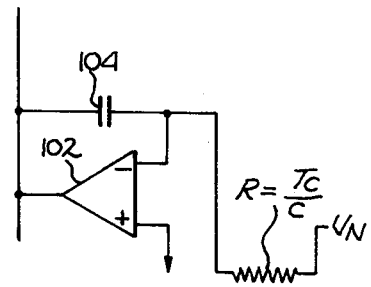

Now referring to FIG. 8, the circuit for the band pass filter on the input of the receiver chip 32, as shown in block diagram form and FIGS. 4 and 7, may be seen. The receive signal comes in as the input voltage on pin 9, being coupled to line 72 through capacitor 74, and through additional parallel capacitor 76 if the gate 78 is on as a result of the control signal B300. This is illustrative of the manner in which the various parameters, particularly capacitance values are controlled by the digital clock generator, i.e., the control signal B300 determines the coupling of the input to line 72 to determine whether that coupling is through capacitor 74 only or is by way of the parallel combination of capacitors 74 and 76. In other places within the circuit, such as in the case of capacitors 80, 82, 84, 86, and 88, various control signals are used to determine the effective capacitance between lines 90 and 92. In still other cases, the coupling is clock-related, such as by way of example, in the case of the coupling capacitor 94 as controlled by gates 96, 98, and 100. This particular portion of the circuit, together with amplifier 102 and feedback capacitor 104, also provides a convenient circuit segment to provide an explanation illustrative of the operation of the switched capacitor recursive filters. For convenience, that portion of the circuit is reproduced in FIG. 15 so as to provide better focus on the specific circuit elements being described. It will be noted that gate 96 and gate 98 are both driven by the same clock signal $\Phi_2$, whereas gate 100 is driven by $\overline{\Phi_1}$. These signals and the circuit for generating these signals is shown in FIG. 9B. It can be seen that as a result of inverter 106, $\overline{\Phi_1}$ and $\overline{\Phi_2}$ are complimentary signals. Referring to FIG. 15 again, when $\overline{\Phi_2}$ turns on both gates 96 and 98, both sides of capacitor 94 are tied to $V_r$ so that the capacitor is discharged during that portion of the cycle. During a subsequent portion of the cycle, gates 96 and 98 are turned off and gate 100 is turned on by $\overline{\Phi_1}$. Considering the voltage at one side of the capacitor 94 to be the voltage $V_s$ at the feedback summing point for amplifier 102 and the voltage on the other side of the capacitor to represent the input voltage $V_n$ for this segment of the circuit, it can be seen that when $\overline{\Phi_1}$ turns on gate 100, capacitor 94 will be charged to a voltage $V_{in} - V_s$. Thus, during this portion of the cycle, the charge which flows into (or from) $V_s$ is $Q = C (V_{in} - V_s)$. Obviously, of course, when gate 100 is again turned off and gates 96 and 98 turned on, the capacitor 44 will be discharged in readiness for the next cycle. If the entire cycle is repeated every $T_c$ seconds, then the current flow I into the summing point will be $I = C (V_n - V_s)/T_c$. Thus the size of an equivalent resistor which would perform the same function as capacitor 94 and the various gates of FIG. 15 is $R = T_c/C$. If the switching rate $f_c = 1/T_c$ is much larger than the signal frequencies of interest, then the time sampling of the signal which occurs in this circuit and the other switched capacitor circuits which are used in this invention can be ignored, and the switched capacitors can be considered as a direct replacement for conventional resistors. In that regard, it will be noted from FIG. 9B that $\overline{\Phi_1}$ and $\overline{\Phi_2}$ are both approximately 56 kHz, thereby satisfying this requirement.

Figure 10:
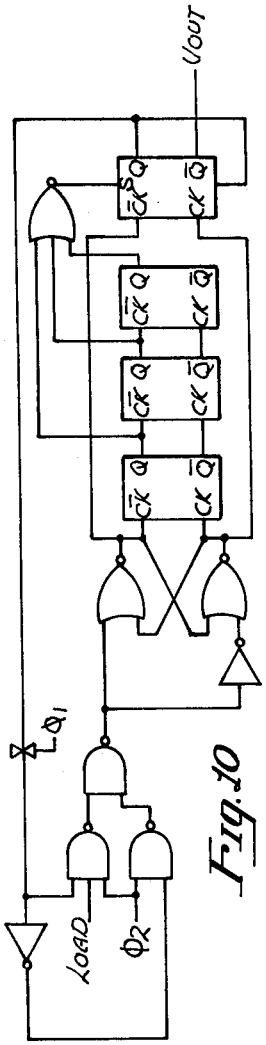
FIG. 10 is a circuit diagram for the digital one shot on the receiver chip.

The circuit details for the limiter 54 and the zero cross detector 56, shown in FIGS. 4 and 7, are provided in FIG. 7. The details for the digital one shot 58 are provided in FIG. 10. Note that this circuit is clocked by the clock signals $\Phi_1$ and $\Phi_2$ so as to control the pulse width to approximately 110 ms, an important factor in the proper operation of the circuit, as substantial variations in pulse width would alter the output of low pass filter 60 from the desired response. In that regard, it will be noted that the zero cross detector 56 (see FIG. 7) is also clocked by the reference signal $\Phi_1$ and $\Phi_2$, so that the signal into the digital one shot will not cause a second false trigger.

Figure 11:
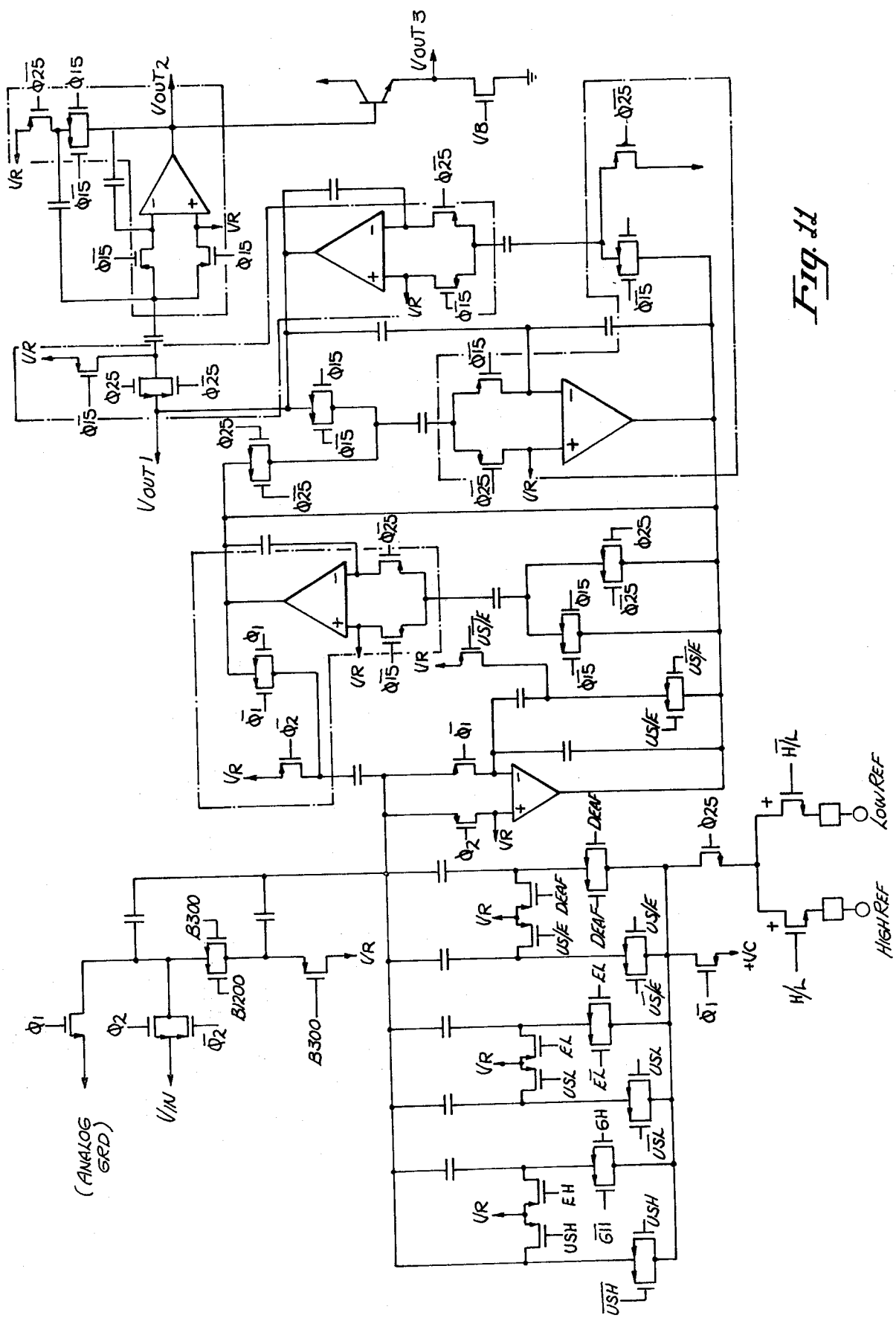
FIG. 11 is a circuit diagram of the low pass filter of the receiver.

The circuit diagram for the low pass filter 60 of FIGS. 4 and 7 is provided in FIG. 11. This circuit, again a switched capacitor circuit, actually provides three output signals, the first being coupled to the carrier threshold detector 68, the second providing the detected output signal for coupling to the data threshold detector (comparator) 64, and the third providing the eye test point output. As with the case of the band pass filter, the low pass filter is controlled by a number of control signals put out by the digital control and clock generator to not only clock the switched capacitors, but to also couple in additional or fewer capacitors to affectively vary the value of various capacitors in the circuit to adjust the circuit for the frequency parameters for the various modes as identified in FIG. 5.

Figure 12A:
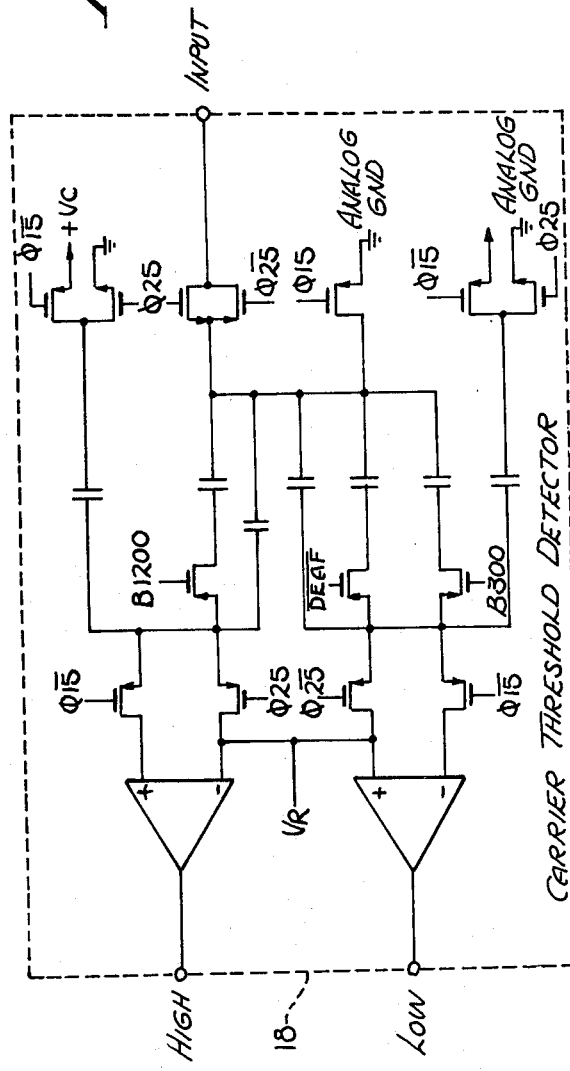
FIGS. 12a and 12b are circuit diagrams of the carrier threshold detector and the carrier on/off delay circuits, respectively, of the receiver.
Figure 12B:
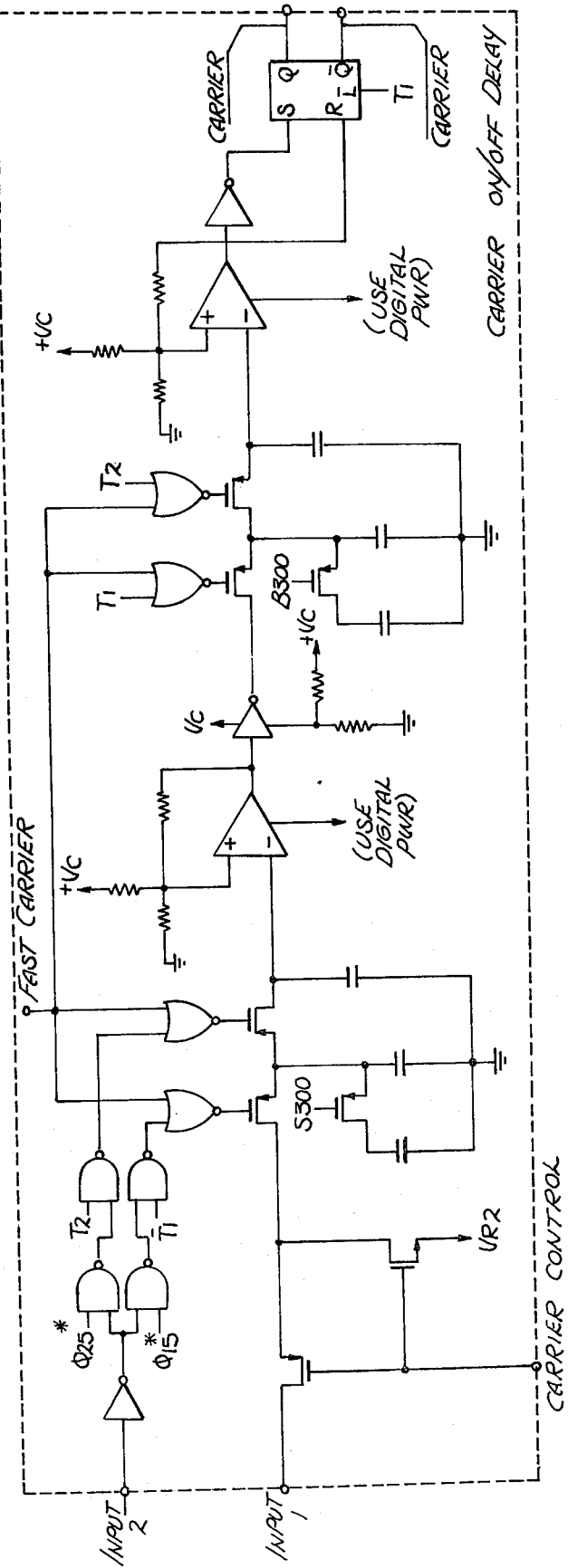

Finally, the circuit for the carrier threshold detector 68 and the on-off delay 70 may be seen in FIGS. 12A and 12B respectively. The general function of these circuits has already been described, and since the circuits are shown in complete detail and utilize general principals already hereinbefore described, a further explanation of the circuits is not warranted.

Now referring to FIG. 4, a block diagram for the transmitter chip 34 may be seen. The purpose of this chip is to receive the one-eighth clock frequency 447.4 kHz and after appropriate dividing down of this frequency in a controlled manner in accordance with the mode of operation, to synthesize a sine wave output of appropriate amplitude and frequency for transmission on the phone line. Thus the 447.4 kHz clock signal is coupled to a ten bit binary rate multiplier which multiplies the frequency by a factor M/1024 where M is an integer determined by the state of the ten control inputs thereto. The output of the binary rate multiplier 108 is further divided by 25 by a divider 110 after which time the signal passes through a four bit Johnson counter 112, the outputs of which are resistively summed to provide a synthesized sine wave output on the output line. One of the features of the present invention is the manner in which the binary rate multiplier is controlled, i.e., specifically through a multiplexer 114 controlled by the X/Y mode select. When the X/Y mode select is set so that the electronic switch is in the position indicated by the symbolic multiplexing switch, the four inputs $A_0$ through $A_3$ are used by a random logic array 116, effectively operating as a read-only memory, to provide any of 16 ten bit numbers for the control of the ten bit binary rate multiplier. Thus, the control inputs $A_0$ through $A_3$ provide the appropriate control for the binary rate counter so that the final synthesized output signal has the desired frequency for the particular mode involved. With the X/Y mode select in the opposite position, it can be seen that all of the inputs $A_0$ through $A_9$ are directly coupled through the multiplexer to the binary rate multiplier so that any desired control signal can be directly applied thereto by directly applying the desired control through $A_0$ through $A_9$. It will be noted from FIG. 2 that the control lines $A_4$ through $A_9$ are not brought out in the modem package of FIG. 1, as these special controls for the binary rate multiplier provide a degree of flexibility and capability not required in FSK modems. This capability however, does provide a frequency programming capability for the transmitter chip to provide a broad range of application for the chip for any requirements wherein programmable frequency division with a sine wave output is useful.

Now referring to FIGS. 6a, 6b, and 6c, the details of the circuits for the transmitter chip 34 as shown in FIGS. 2 and 3 may be seen. The circuit is a straightforward logic circuit which may be readily broken down into various functional blocks which closely follow the description of the operation hereinbefore given with respect to FIG. 3. (FIGS. 6a, 6b and 6c are portions of a circuit diagram which for ease of presentation has been broken into three sections, FIG. 6a being the left portion, FIG. 6b the right portion and FIG. 6c the top portion joining FIG. 6a.) Referring first to FIG. 6a, the basic 447.4 kHz clock input is provided to the ten bit binary rate multiplier 108. The rate multiplier is comprised of a plurality of countdown flip-flops, the outputs of which are logically combined by a series of gates, controlled in part by ten input lines to the right of the figure. It will be noted that each of these lines goes to one of the ten gates 118 so as to control the output of the binary rate multiplier in accordance with the ten control signals applied thereto. In addition, the transmitter on-off signal TXE is coupled to the reset line of the countdown flip-flop chain of the binary rate multiplier 108 of FIG. 6a as well as to the reset line of the divide by 25 countdown flip-flop chain 110 and the four bit Johnson counter 112.

Now referring to FIG. 6b, the logic which provides the ten control signals to the binary rate counter 108 of FIG. 6a may be seen. In this figure, a first series of gates 120 and a second series of gates 122 are used. It will be noted that the X/Y mode select input signal is first inverted by inverter 124 and then coupled through line 126 to the lower (noninverting) control of gates 122 and to the upper (inverting) control of gates 120. The output of inverter 124 is again inverted by inverter 128 and applied through line 130 to the inverting control for gates 122 and the noninverting control for gates 120. These amplifiers within block 114 comprise the multiplexer 114 of FIG. 3 as shall be subsequently described in detail.

The circuit portion identified within the block 116 of FIG. 6b comprises a random logic array or read-only memory 116 of FIG. 3. It may be seen that this circuit has as its inputs the signals $A_0$ through $A_3$ and in response thereto provides 16 ten bit words with each bit coupled to one of coupling gates 120. At the same time, the four input signals $A_0$ through $A_3$ are coupled to the lower four coupling gates 122 with the upper six coupling gates being coupled to the further control lines $A_4$ through $A_9$. With the X/Y mode select in one state, the control word from the random logic array 116 is coupled through gates 120 to the ten control lines of the binary rate multiplier, whereas with the X/Y mode select in the other state, the ten direct control signals $A_0$ through $A_9$ are coupled through gates 122 to the ten control lines of the binary rate multiplier 108. Finally, as mentioned before, the output of the binary rate multiplier is provided to the divide by 25 divider 110 to the four bit Johnson counter 112 and the sine wave summer 132 to provide the frequency shift keyed output FSKO.

There has been described herein a new and unique universal frequency shift keyed modem chip set which will allow the realization of substantially any of the most popular frequency shift keyed modems using only two large scale integrated circuits. In applications where the overall system must have sufficient flexibility so as to communicate between modems of different types, the chip set of the present invention may be controlled so as to be able to switch between modem types as may be required. The chip set is comprised of two large scale integrated circuits, one providing the receive function and the other providing the transmit function. The receive circuit includes all required filtering and detection on chip, though is provided with sufficient gates so that various functions may be bypassed as desired (usually to allow the accomplishment of the bypassed function off chip). Through frequency control, the receiver circuit may also be used to detect dial tones without circuit modification. The transmitter chip, of course also controllable for transmitting to duplicate the characteristics of the same popular frequency shift keyed modem as the receiver chip will receive is further provided with an externally controllable multiplexer so that the frequency programming may be done directly to provide the full range of frequency programming capability of binary rate multipliers rather than being limited to only those frequencies (frequency ratios) characteristic of the more popular FSK modem as determined by the fixed logic array on the chip. This capability in the preferred embodiment results in an integrated circuit comprising a full ten bit binary rate multiplier having a sine wave output having many applications other than FSK modems. Obviously, while only the preferred embodiment has been disclosed and described in detail herein, it will be understood by those skilled in the art that various changes in form and detail may be made therein without departing from the spirit and scope of the invention.

I claim:
1. A frequency shift keyed receiver comprising
a band pass switched capacitor filter means operative on clock signals provided thereto for receiving a frequency shift keyed input signal and providing a band pass filtered output in response thereto, said switched capacitor filter means being an active RC filter utilizing switched capacitors in place of resistors,
a detection means coupled to said switched capacitor filter means for detecting the frequency of said band pass filtered output thereof,
output means coupled to said detection means for providing output signals indicative of a mark and a space responsive to the frequency detected by said detection means, and clock generator means coupled to said switched capacitor filter means for generating clock signals and providing said clock signals to said switched capacitor filter means, said clock generator means including means responsive to a plurality of control input signals to provide a plurality of control signals to said band pass switched capacitor filter means, said switched capacitor filter means being responsive to said control signals to change the filtering characteristics thereof between originate and answer frequency ranges.

2. A frequency shift keyed modem comprising: a receiver having (a) a band pass filter having an input terminal for coupling to a frequency shift keyed input signal, said band pass filter being a switched capacitor filter response to clock and signals to filter a frequency shift keyed signal with band pass filter characteristics determined by said clock and control signals, said band pass filter being an active RC filter utilizing switched capacitors in place of resistors, (b) a zero crossing detection means coupled to said band pass filter and responsive to the output thereof to provide a detection means output responsive to the zero crossings of the output of said band pass filter, (c) a low pass filter coupled to said zero crossing detection means and responsive to said detection means output to provide a low pass filter output of an amplitude dependent upon the frequency of the detection means output, said low pass filter being a switched capacitor filter responsive to clock and control signals to filter the detection means output with low pass filter characteristics determined by said clock and control signals, said low pass filter being an active RC filter utilizing switched capacitors in place of resistors, (d) a data threshold detector coupled to said low pass filter and responsive to the output thereof to provide a digital output, and (e) a control and clock generator coupled to said band pass and low pass filter and having a plurality of control signal input lines and being responsive thereto to provide clock and control signals to said band pass and low pass filters, whereby control signals on the control signal input lines may cause said receiver to demodulate a frequency shift keyed signal of any of a predetermined number of frequency shift keyed signal formats, and a transmitter having (a) a binary rate multiplier responsive to a clock signal and a plurality of control signals to provide a binary rate multiplier output frequency in response thereto, and (b) a multiple bit Johnson Counter having its input coupled to said binary rate multiplier, the outputs of said Johnson Counter being summed by a plurality of impedances coupled in parallel to provide the frequency shift keyed transmitter output signal.

3. The frequency shift keyed receiver of claim 1 wherein said detection means includes a switched capacitor low pass filter means, operative on clock signals provided thereto, said clock generator means also being coupled to said switched capacitor low pass filter means to provide clock signals thereto.

4. The frequency shift keyed receiver of claim 3 wherein said clock generator means includes means responsive to a plurality of control input signals to provide a plurality of control signals to said low pass switched capacitor filter means, said low pass switched capacitor filter means being responsive to said control signals to change the filtering characteristics thereof, whereby said receiver can be controlled by said plurality of control signals to respond to different frequency shift keyed input signal formats.

5. The frequency shift keyed receiver of claim 3 wherein said detection means is further comprised of a switched capacitor carrier threshold detector operative on clock signals provided thereto for providing a threshold detector output signal indicative of the presence or absence of a carrier signal, said clock generator means also being coupled to said threshold detector for providing clock signals thereto.

6. The frequency shift keyed receiver of claim 5 wherein said clock generator means further includes means responsive to a plurality of control input signals to provide control signals to said threshold detector, said threshold detector being responsive to said control signals to change the threshold detector characteristics in accordance with different frequency shift keyed input signal formats.

7. A frequency shift keyed receiver comprising a band pass filter having an input terminal for coupling to a frequency shift keyed input signal, said band pass filter being a switched capacitor filter response to clock and control signals to filter a frequency shift keyed signal with band pass filter characteristics determined by said clock and control signals, a zero crossing detection means coupled to said band pass filter and responsive to the output thereof to provide a detection means output responsive to the zero crossing of the output of said band pass filter, a low pass filter coupled to said zero crossing detection means and responsive to said detection means output to provide a low pass filter output of an amplitude dependent upon the frequency of the detection means output, said low pass filter being a switched capacitor filter responsive to clock and control signals to filter the detection means output with low pass filter characteristics determined by said clock and control signals, each of said switched capacitor filter means being an active RC filter utilizing switched capacitors in place of resistors, a data threshold detector coupled to said low pass filter and responsive to the output thereof to provide a digital output, and a control and clock generator coupled to said band pass and low pass filter and having a plurality of control signal input lines and being responsive thereto to provide clock and control signals to said band pass and low pass filters, whereby control signals on the control signal input lines can cause said receiver to demodulate a frequency shift keyed signal of any of a predetermined number of frequency shift keyed signal formats.

8. The receiver of claim 7 further comprised of a switched capacitor carrier threshold detector coupled to said detection means and operative on clock signals provided thereto for providing a threshold detector output signal indicative of the presence or absence of a carrier signal, said control and clock generator also being coupled to said threshold detector for providing clock signals thereto.

9. A frequency shift keyed modem comprising: a receiver having
- (a) a band pass switched capacitor filter means operative on clock signals provided thereto for receiving a frequency shift keyed input signal and providing a band pass filtered output in response thereto, said switched capacitor filter means being an RC active filter utilizing switched capacitors in place of resistors,
- (b) a detection means coupled to said switched capacitor filter means for detecting the frequency of said band pass filtered output thereof,
- (c) output means coupled to said detection means for providing output signals indicative of a mark and a space responsive to the frequency detected by said detection means,
- (d) clock generator means coupled to said switched capacitor filter means for generating clock signals and providing said clock signals to said switched capacitor filter means, said clock generator means including means responsive to a plurality of control input signals to provide a plurality of control signals to said band pass switched capacitor filter means, said switched capacitor filter means being responsive to said control signals to change the filtering characteristics thereof between originate and answer frequency ranges, and
- a transmitter having a binary rate multiplier responsive to a clock signal and a plurality of control signals to provide a binary rate multiplier output frequency in response thereto representing a frequency shift keyed transmitter output signal.

10. The frequency shift keyed modem of claim 9 wherein said transmitter is further comprised of a multiple bit Johnson Counter having its input coupled to said binary rate multiplier, the outputs of said Johnson Counter being summed by a plurality of impedances coupled in parallel to provide the frequency shift keyed transmitter output signal.

11. The frequency shift keyed modem of claim 9 wherein said detection means includes a switched capacitor low pass filter means operative on clock signals provided thereto, said clock generator means also being coupled to said switched capacitor low pass filter means to provide clock signals thereto.

12. The frequency shift keyed receiver of claim 11 wherein said clock generator means includes means responsive to a plurality of control input signals to provide control signals to said low pass switched capacitor filter means, said low pass switched capacitor filter means being responsive to said control signals to change the filtering characteristics thereof, whereby said receiver is controllable by said plurality of control signals to respond to different frequency shift keyed input signal formats.

13. The frequency shift keyed receiver of claim 11 further comprised of a switched capacitor carrier threshold detector operative on clock signals provided thereto for providing a threshold detector output signal indicative of the presence or absence of a carrier signal, said clock generator means also being coupled to said threshold detector for providing clock signals thereto.

14. The frequency shift keyed receiver of claim 13 wherein said clock generator means further includes means responsive to a plurality of control input signals to provide a plurality of control signals to said threshold detector, said threshold detector being responsive to said control signals to change the threshold detector characteristics in accordance with different frequency shift keyed input signal formats.

* * * * *

Disclaimer and Dedication 4,466,106.—*Arthur L. Serrano*, Canoga Park, Calif. FREQUENCY SHIFT KEYED MODEM CHIP SET. Patent dated Aug. 14, 1984. Disclaimer and Dedication filed Aug. 28, 1989, by the assignee, Practical Peripherals, Inc.

Hereby disclaims and dedicates to the Public the entire term of said patent.
[*Official Gazette November 21, 1989* ]